United States Patent

Wright et al.

[15] 3,664,899

[45] May 23, 1972

[54] REMOVAL OF ORGANIC POLYMERIC FILMS FROM A SUBSTRATE

[72] Inventors: Archibald N. Wright, Schenectady; Richard C. Merrill, Glens Falls, both of N.Y.

[73] Assignee: General Electric Company

[22] Filed: Dec. 29, 1969

[21] Appl. No.: 888,380

Related U.S. Application Data

[63] Continuation-in-part of Ser. No. 731,090, May 29, 1968.

[52] U.S. Cl. .......... 156/8, 156/3, 156/7, 156/13, 156/15, 156/16, 156/17, 96/35.1, 117/5.5, 117/8, 117/8.5, 117/93.31

[51] Int. Cl. .......... B29c 17/08, C23b 3/04

[58] Field of Search .......... 117/5.5, 8.5, 8, 93.31, 212; 96/35.1; 156/7, 3, 16, 15

[56] References Cited

UNITED STATES PATENTS

| | | | |
|---|---|---|---|
| 3,346,384 | 10/1967 | Gaynor | 96/36 |
| 3,097,097 | 7/1963 | Oster et al. | 96/30 |
| 2,892,712 | 6/1959 | Plambeck | 96/48 |
| 3,518,111 | 6/1970 | Wright et al. | 117/93.31 |
| 3,042,566 | 7/1962 | Hardy | 156/18 |

OTHER PUBLICATIONS

Wilcox et al., Ultraviolet Irradiation of Polymeric Materials, American Chem. Society, Preprint No. 21 pg. 382– 404 (1961).

Harwood et al., Effects of Radiation on Materials, Reinhold Publishing Corporation, N.Y., (1958) pg. 270– 273.

Florin et al., Mechanism of the Depolymerization of Polytetrafluoroethylene with Pyrolytic & Radialytic Initiation, Jour. of Research, N.B.S. (March 1966) pg. 115– 131.

Tsui et al. IBM Technical Disclosure, Removal of Polymerized Photoresists... 17 a Discharge Vol. 9, No. 9 pg. 1228 (1967).

*Primary Examiner*—Alfred L. Leavitt
*Assistant Examiner*—M. F. Esposito
*Attorney*—Richard R. Brainard, Paul A. Frank, Joseph T. Cohen, Charles T. Watts, William A. Teoli, Frank L. Neuhauser, Oscar B. Waddell and Joseph B. Forman

[57] ABSTRACT

A solvent free method for removing thin organic polymeric film from a substrate is provided utilizing ultraviolet light at wavelengths below 3,500 Angstroms. The method also can be employed to effect the direct configurational removal of organic polymeric film from etchable substrates to provide for the fabrication of microelectronic circuits.

11 Claims, 5 Drawing Figures

Inventors:
Archibald N. Wright,
Richard C. Merrill,
by William A. Teoli
Their Attorney.

REMOVAL OF ORGANIC POLYMERIC FILMS FROM A SUBSTRATE

This application is a continuation-in-part of copending application Ser. No. 731,090, filed May 29, 1968, and assigned to the same assignee as the present invention.

Film-forming organic polymers have long been employed as protective and decorative coatings on various substrates. Sometimes it becomes necessary to remove the organic film from the substrate surface. One method employed is contacting the organic film with organic solvent combined, in some instances, with mechanical action such as scraping or scrubbing. In other techniques, resort has been given to the use of strong acid or alkaline cleaning solutions or even the burning off of the organic film at elevated temperatures from the substrate surface.

Often, configurational removal or organic polymeric film serving as a resist from the surface of an etchable substrate is desirable to allow for etching of exposed substrate surface in a patterned manner. Upon completion of the etching step, it is sometimes desirable to remove the organic polymeric resist from the remaining substrate surface.

Prior to the present invention, one method for effecting the configurational removal of organic polymeric film from a substrate was by employing a photosensitive polymer. The substrate was treated with the photosensitive polymer and then placed in an exposure station with a contact mask to alter the solubility characteristics of the polymer by the use of light. Configurational removal of the organic polymer was readily accomplished by use of a wash solvent to dissolve soluble organic polymeric film. After the exposed substrate surface was etched with a suitable etchant, the removal of the insoluble photoresist either positive or negative from the remaining substrate was often difficult. The remaining resist was often insoluble in most organic solvents. Removal of the resist was generally effected after extended soaking combined with mechanical attrition or burning.

As taught in our copending application Ser. No. 731,090, filed May 29, 1968, ultraviolet light can be used to effect the direct configurational removal of certain organic polymeric films formed by the surface photopolymerization of various halogenated olefinically unsaturated hydrocarbons, such as tetrafluoroethylene, hexafluoropropylene, hexachlorobutadiene, etc. A method for depositing these surface photopolymerized films is described by Wright application Ser. No. 530,971, filed Mar. 1, 1966, now U.S. Pat. No. 3,522,226, and assigned to the same assignee as the present invention. The ability to directly remove these surface photopolymerized organic polymeric films, which are already inherently insoluble in most organic solvents and highly chemically-resistant, qualifies them as positive photoresists. The removal of these positive resists by conventional means after the etching of the substrate is complicated by the chemical inertness and insolubility of the film.

The present invention is based on the discovery that the above described method of utilizing ultraviolet light to effect the removal of thin organic polymeric films consisting essentially of chemically combined carbon atoms and halogen atoms to produce positive photoresists, can be employed to effect the final removal from various substrates of a much broader variety of films utilized as either positive or negative resists and derived from either a wide variety of photosensitive organic polymers or from the surface photopolymerization of a broad class of photopolymerizable monomers in vaporous form. As a result, the organic polymer film removal method of the present invention overcomes many of the prior art difficulties associated with removing organic solvent insoluble organic polymeric films from various substrates. In addition, improved capability for making direct positive photoresists from organic polymeric films produced by the surface photopolymerization of a wide variety of organic polymerizable materials in vaporous form also is provided.

In accordance with the present invention, there is provided a method for effecting the removal or organic polymeric film from the surface of a substrate to produce substrate surfaces substantially free of such organic polymeric film by effecting the removal of the organic polymeric film with ultraviolet light at a wavelength of from 1,800 to 3,000 Angstroms in the presence of oxygen at a partial pressure of at least 1 torr.

Among the organic polymeric films which can be removed from various substrates by the method of the present invention, there are included organic polymers such as taught in copending application of Donald A. Bolon, Ser. No. 888,379, filed concurrently herewith, now abandoned and assigned to the same assignee as the present invention. For example, there are included $$H\left[C\equiv C-\left(CH_2O\right)_m-R-\left(OCH_2\right)_m-C\equiv C\right]_n H$$

where $m$ is 0 or 1 and $n$ is an integer and is at least 10. When $m$ is 0, the acetylenic polymers are polymers of diethynylalkanes(alkadiynes), diethynylarenes or diethynylhaloarenes, i.e., R is alkylene, arylene, which includes alkyl-substituted arylene, or haloarylene, which includes alkyl-substituted haloarylene. The diacetylenic monomers of the alkylene series are readily made by reaction of sodium acetylide and an alkylene dihalide. The diacetylenic monomers of the arylene and haloarylene series are readily made by halogenation followed by dehydrohalogenation of the corresponding divinylarenes, e.g., divinylbenzenes, divinyltoluenes, divinylnaphthalenes, etc., or diacetylarenes, diacetylbenzenes, diacetyltoluenes, diacetylxylenes, diacetylnaphthalenes, diacetylanthracenes, etc.

The photosensitizers which can be used in combination with the above polyacetylene are any materials capable of absorbing the actinic radiation to which it is exposed and be capable of using the energy so absorbed to accelerate the cross-linking of the polymer in which it is incorporated, such as various dyes, carbonyl compounds, for example, ketones, aldehydes, anhydrides, quinones, etc., 1,4-diethynylbenzene, etc., in the range of from 0.1 to 10 percent by weight based on the weight of acetylenic polymer and photosensitizer.

In addition to the above acetylenic polymers, there also can be employed in the practice of the invention, organic polymers substituted with unsaturated imido radicals as disclosed in copending applications of Klebe and Windish, Ser. Nos. 838,322 and 846,623, filed July 1, 1969, and assigned to the same assignee as the present invention. There are included by these unsaturated imido-substituted organic polymers, polyarylenoxides, polycarbonates, polyesters, polyamides, polystyrene, etc. Additional photosensitive polymers which can be used are shown by Merrill U.S. Pat. No. 2,948,610 directed to azide polymers, Minsk U.S. Pat. No. 2,725,372 directed to unsaturated esters of polyvinylalcohol, Eastman Kodak Photoresist KPR and KMER, cinnamoyl-polystyrene resins, etc. Other photosensitive materials are described in Light-Sensitive Systems, Chapter 4, pages 137–155, by Jaromir Kosar, John Wiley & Sons, Inc., New York (1965). For example, polyvinyl cinnamate, styrene maleic-anhydride copolymer with cinnamide, N-(cinamolylphenyl)urethane derivatives, partially hydrolyzed cellulose acetate with 3- or 4-($\alpha$-cyanocin-amido)phthalic anhydride, soluble polyamides, light-sensitive cinnamylidene arylvinylacetophenone, etc., polymers shown in U.S. Pat. No. 2,908,667 Williams, Chalcone-type compounds, such as benzolacetophenone, etc.

In addition to the above preformed organic polymers which can be applied to various substrates in the form of an organic solvent solution, or in the form of a melt, either by spraying or dipcoating techniques, spinning techniques, etc., there also can be removed within the scope of the method of the present invention, organic polymer films made by the surface photopolymerization of various photopolymerizable organic monomers in vaporous form, such as dienes, for example butadiene, 1,5-hexadiene, 2,4-hexadiene, hexachlorobutadiene, tetrafluoroethylene, ethylene, methylmethacrylate, N-phenylmaleimide, phenol, pyromellitic dianhydride, acrylonitrile, etc., and other materials described.

The above-described surface photopolymerized organic films are more particularly described in copending applications of Wright, Ser. No. 530,971, filed Mar. 1, 1966, now U.S. Pat. No. 3,522,226; Wright et al., Ser. No. 598,364, filed Dec. 1, 1966, now U.S. Pat. No. 3,518,111; Wright, Ser. No. 618,132, filed Feb. 23, 1967, now U.S. Pat. No. 3,522,076; Wright et al., Ser. No. 622,944, filed Mar. 14, 1967, now Pat. No. 3,578,425; Wright et al., Ser. No. 628,447, filed Apr. 4, 1967, now abandoned; and Wright et al., Ser. No. 812,262, filed Apr. 1, 1969, all assigned to the same assignee as the present invention.

Etchable substrates, when can be employed in the practice of the invention, include any etchable metal, metalloid or oxide thereof, such as gold, silver, aluminum, tin, copper, silicon oxide, etc. Substrates which can be treated by surface photopolymerized monomers to produce protective coatings other than resists include wood, paper, plastics, textiles, etc. The removal of polymer also can be applied to the removal of cooking residues from ovens, etc.

In accordance with the method of the present invention, organic polymeric film on a substrate surface is subjected to ultraviolet light at a wavelength of from between about 1,800 Angstroms to about 3,500 Angstroms in the presence of an oxygen-containing atmosphere for a period of time sufficient to completely remove the organic polymer from the surface of the substrate in contact with the organic polymeric film.

To achieve effective results within the parameters of the method of the present invention, it has been found desirable to provide for a rate of film removal of at least 10 Angstroms per minute. Of course, a rate of removal such as at least 100 Angstroms, per minute, or higher, would be preferred so that a film thickness of up to as high as 10,000 Angstroms can be removed in a reasonable time.

Various factors have found to influence the rate of removal, such as oxygen concentration, temperature at the surface of the organic polymeric film under ultraviolet light exposure, the intensity of flux, and the wavelength of the ultraviolet light employed, the nature of the organic polymeric film being removed, etc. Experience has shown, for example, that optimum results can be achieved if the organic polymeric film is exposed to ultraviolet light in the presence of an oxygen-containing atmosphere, which can include, for example, air or other oxygen-containing atmosphere, such as mixtures of oxygen and an inert gas, where the oxygen is at a partial pressure of at least 1 torr to 760 torr and preferably about 10 torr to about 160 torr employing a gas stream over the substrate consisting essentially of air, oxygen, or a mixture of oxygen with an inert gas. Effective results can be achieved if the oxygen is present at a partial pressure of at least 1 torr, while an oxygen-containing atmosphere having oxygen as the sole component up to atmospheric pressure or higher, also can be employed.

It has been found that the temperature at which film removal can be effected at the above-described rates when measured at the organic polymeric film surface is from about 20° to 300° C as measured by a thermocouple in the radiation flux. However, optimum results can be achieved at temperatures of 180° to 230° C, depending, of course, upon the heat stability characteristics of the substrate and the organic polymeric film removed.

In order to maximize the rate of removal, ultraviolet light having a wavelength in the range of from 1,800 Angstroms to 3,500 Angstroms and preferably 1,849 Angstroms to 3,000 Angstroms can be employed. The intensity of the light in the effective region also should be at least 100 milliwatts per square centimeter on the film surface. Intensity can be readily determined by the rating of the lamp employed and the distance the lamp is utilized from the surface of the organic polymeric film. Determination of intensity can be made with the use of a thermopile as described by R.G. Johnston and R.P. Madden, Applied Optics, Vol. 4, No. 2 Dec. 1965) page 1,574.

It has been found that the rate of removal of the organic polymeric film from the substrate decreases somewhat as the thickness of the remaining substrate approaches about 10 percent of its initial thickness. However, increasing the substrate temperature under such conditions provides for a more uniform rate of removal.

By the method of the present invention, therefore, organic polymeric films having thicknesses in the range of up to 1 mil or higher can be effectively removed. Removal of organic polymeric film in accordance with the invention can signify a carbon-free surface as established by the method of Auger emission analysis, described by L.A. Harris, Journal of Applied Physics, Vol. 39, page 1,419 (1968).

The foregoing description and other objects, features and advantages of the present invention will be apparent from the following and more particular description of preferred embodiments of the invention as illustrated in the accompanying drawings.

Figures 1, 2, 3, 4, 5:
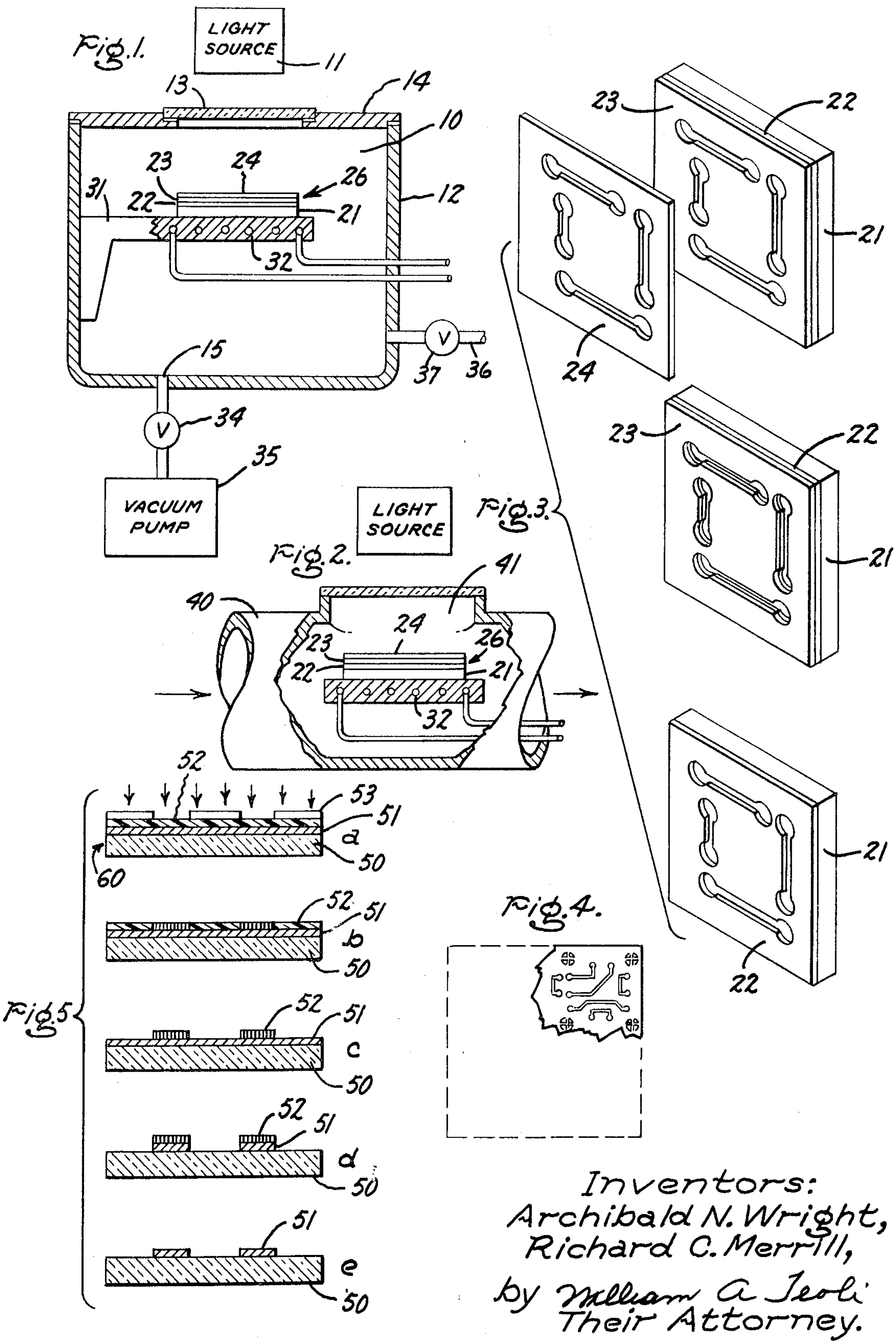
FIG. 1 illustrates an apparatus useful in practicing the method of the invention in a closed system, such as an evacuated chamber.
FIG. 2 illustrates a method of practicing the method of the present invention in an open system, such as under atmospheric pressure.
FIG. 3 illustrates various views in perspective showing a stencil mask and the results which can be achieved with a substrate having an etchable layer and an organic polymeric film in the form of a positive photoresist in the fabrication of an electronic circuit in accordance with the method of the invention.
FIG. 4 illustrates a configurational pattern which has been produced by configurational depolymerization of a thin polymeric film in accordance with the process of the invention.
FIG. 5 illustrates another aspect of removal of polymeric film from the surface of a substrate which has been etched utilizing a negative photoresist.

Referring now to the drawings, there is shown in FIG. 1, an apparatus useful in practicing the method of the invention, it being understood that modifications to illustrate the apparatus may be required. As shown, a vacuum chamber 10 is provided by housing 12, which may be fabricated of either glass or metal, to which is secured upper base plate 14. Opening 15 is provided in the lower portion of vacuum chamber 10 to which is connected a conventional vacuum pump 35 which is used to both evacuate chamber 10 as well as to maintain a predetermined pressure therein. Pump 35 may include any of the various combinations of pumps presently employed in vacuum technology such as by way of example a combination of rotary mechanical pump and a high vacuum mercury or oil diffusion pump. Pump 35 is interconnected to vacuum chamber 10 through valve 34. Above base plate 14 there is positioned a quartz window 13 underneath light source 11 to which composite article 26 can be irradiated with light. Composite article 26 is positioned on holder 31 which contains cooling coil 32. Composite article 26 comprises a stencil 24 positioned on a thin polymer film 23 consisting of a thin organic polymeric film deposited by the surface polymerization of an organic photopolymerizable organic material in vaporous form which is firmly adhered to thin metal film 22 which, in turn, is in contact with substrate 21, which can be in the form of glass, metal, plastic, or other material. Composite article 26 is positioned on holder 31 directly in line with light source 11 turning to quartz window 13.

Extending to the side wall of housing 12 is an inlet 36 connected to valve 37 for a source of inert gas or air which can be bled into vacuum chamber 10 when photolytic polymerization reaction has been completed.

In FIG. 2, there is shown composites of organic polymeric film, metal, and a substrate which can be treated in a circulating oxygen-containing atmosphere such as air, a mixture in which oxygen is present at a partial pressure as previously defined in combination with an inert gas such as nitrogen, argon, etc., or an oxygen atmosphere free of such inert gases, in which the method of the present invention can be practiced in place of the vacuum chamber 10 of FIG. 1. Preferably, the atmosphere in which the depolymerization reaction is to be effected, is free of any reactive gases which could photopolymerize under the conditions employed or interfere with the depolymerization reaction.

The apparatus of FIG. 2 includes a main conduit 40 along which a gas, such as air, flows continuously from left to right; main conduit 40, for example, centered at the open left-end to a source of air under moderate pressure, not shown, and/or at the open right-end to an exhaust fan, not shown. The main conduit 40 includes an opening 41, to which ultraviolet light from light source 11 is directed onto a composite article 26, consisting of a stencil 24 on a thin organic polymeric film 23, which is firmly adhered to metal 22 on substrate 21, which may be glass. Composite article 26 is positioned on holder 31, which contains a cooling coil 32.

A composite 26, for example, as shown in FIGS. 1 and 2, can be fabricated in accordance with the method of the invention as illustrated in FIG. 3. An open stencil mask 24 can be employed to effect the configurational removal of surface photopolymerized organic polymeric film 23 to expose a positive image of underlying etchable substrate 22. The composite 26 can be made, for example, by evaporating a metal onto a glass substrate and thereafter effecting the surface photopolymerization of photopolymerizable material such as N-phenylmaleimide or hexachlorobutadiene in vaporous form. After the organic polymeric film has been configurationally removed, the underlying exposed substrate is etched. The remaining polymeric film is then removed by irradiating the etched substrate in accordance with the method of the invention producing a composite of the evaporated metal on glass having a positive image of the original stencil etched into the surface of the metal.

FIG. 4 is an illustration of a patterned depolymerization of a thin polymer film on a thin gold film substrate on a glass substrate. The thin polymer film was approximately 200 Angstroms thick and was produced by the ultraviolet surface photopolymerization of hexachlorobutadiene as disclosed in the previous-mentioned applications Ser. Nos. 530,971 and 618,132, or N-phenylmaleimide disclosed in Ser. No. 812,262. A mask having circles approximately 2 mils wide with lines approximately 1 mil wide interconnecting the circles was placed over the substrate and the total composite irradiated with ultraviolet light. The polymer film was removed in this manner from the portion exposed to ultraviolet irradiation, i.e. lines and circles. A gold etchant solution of iodine and potassium iodide in water was sprayed on the exposed gold layer, which was completely removed. The line spaces in FIG. 4 leading from the circles are approximately 1 mil wide and the circles are approximately 2 mils in diameter, showing the excellent resolution obtained by the patterned depolymerization process of this invention. Lines as fine as 10 microns in width have been produced employing a metal film mask on quartz where the metalized side was in direct contact with the polymer film.

FIG. 5 illustrates how the method of the invention can be applied to effect the removal of organic polymeric film from an etched substrate, where the film has been employed as a negative photoresist. For example, *a* shows a composite 60 consisting of a substrate 50, for example glass onto which an evaporated metal film 51 has been applied with is covered with an organic polymeric film 52 and a contact mask 53. As shown in *b* , the composite has been exposed to light and certain portions of the organic polymer film have been insolubilized. In *c*, the substrate has been washed in an organic solvent and *d* shows the etched substrate with remaining metal protected by the organic polymeric resist. The method of the invention can be employed by treating the etched substrate in the apparatus of FIGS. 1 or 2 in accordance with the practice of the invention to produce composite *e*, which is a negative image of the original mask of the metal film on the glass substrate.

The etching solutions which can be employed to etch the metal substrates in the process of this invention are well-known in the art.

For a silver substrate, one could employ any of the following etchants: (1) a matte surface can be produced by subjecting the metal surface to a solution of chromium trioxide (40 grams), sulfuric acid (20 grams) dissolved in 2 liters of water.

Copper can be etched employing any of the following solutions: (1) a ferric chloride solution which is between 2.25 and 3.75 molar can be employed at temperatures of from 32° to 50° C; (2) a solution of ammonium persulfate, 2 pounds per 1 gallon of water to which has been added 1 milliliter of a mercuric chloride solution produced by dissolving 26.7 grams of solid mercuric chloride in 1 liter of water and the etching carried out at 35° to 50° C.

Aluminum can be etched employing: (1) a 5 normal potassium hydroxide solution (100 milliliters) and potassium bromate (44 grams); (2) employing hydrochloric acid and copper carbonate; (3) subjecting an aluminum substrate to a bath containing 10 grams of stannous chlorate and enough water to make 500 cc and subsequently subjecting the aluminum substrate to an etchant comprising hydrochloric acid (concentrated) 1 part by volume, nickelous chloride sufficient to turn solution light green, and water from 4 to 6 parts by volume; or (4) one could employ an aqueous alkaline etching solution containing 20 percent sodium hydroxide at 60° to 90° C.

A tin substrate can be etched, for example, by employing a solution of 50 cc of hydrochloric acid, 100 cc of nitric acid and 850 cc of water.

A lead substrate can be etched employing as an etchant either:

1. a solution containing 200 cc of citric acid, 300 cc of hydrogen peroxide and 500 cc of water; or 2. a solution of 200 cc of acetic acid, 50 cc of hydrogen peroxide and 750 cc of water.

It will, of course, be obvious to those skilled in the arts that other etching solutions can be employed in the process of this invention for the various metal or metal oxide substrates, for example silicon dioxide, which also can be etched. The particular etching bath will be dependent upon the desired speed of etching, the temperature of etching and the like, which will be well understood by those skilled in the art.

The process of the present invention is particularly useful in the production of microcircuits for electronic devices. When the process of the invention is employed in production of microcircuits, the thin polymer films are generally used as insulation films in an etching procedure. For example, after the thin polymer film has been configurationally depolymerized, the exposed metal film can be removed by any of the standard wet etching methods or alternatively the metal film can be removed by photoetching if the metal is one which forms a volatile organic metallic compound. Thus, for example, a gold film could be removed by a photoetching procedure wherein the exposed gold layer is subjected to ultraviolet irradiation in an atmosphere containing methyl iodide or other organic vapor capable of forming free radicals, in a photolytic reaction with light of a predetermined wavelength and the reaction of an adsorbed layer of such vapor is effective to remove those portions of the metal film which are not protected by the thin polymer film remaining after the configurational depolymerization. The organic vapor could then be removed and the protective polymer film irradiated with ultraviolet light so as to remove said film leaving the conducting metal which could form part of a microcircuit.

The following examples serve to further illustrate the invention:

EXAMPLE 1

An evaporated gold film on a glass slide, the gold film being 4,000 to 5,000 Angstroms thick, and having a thin film of polymer containing solely carbon and chlorine deposited by the ultraviolet photopolymerization of hexachlorobutadiene at less than 5 torr and having a thickness of 200 Angstroms, was covered with a metal stencil mask and then placed under an ultraviolet light source at a distance of about 3 centimeters. The material was irradiated with an ultraviolet light source having a wavelength of from 2,000 to 3,500 Angstroms for from 2 to 5 minutes, during which time a stream of air was blown across the surface of the stencil and article in order to remove any vapors formed and also to remove the heat and maintain the sample at about 100° C. The polymer film was removed configurationally. The resultant sample was then treated with a water solution of iodine and potassium iodide (KI, 200 grams, iodine–60 grams, in 1 liter of water) for about 1 minute. The gold in the areas wherein the polymer film had been removed by the ultraviolet treatment was completely dissolved by the etching solution. The resultant pattern had excellent definition with resolution equal to that of the stencil.

Example 2

In this test a gold plated glass slide coated with the polymer containing solely carbon and chlorine, as in Example 1, was employed. A quartz contact mask was placed in contact with the polymer film. An ultraviolet source was placed 4 centimeters above the film and the polymer film irradiated through the quartz mask which has a metal pattern on the portion nearest the polymer film for about 3 minutes, while the surface of the mask was force air cooled. The sample was then treated with the etching solution as in Example 1 and it was found that the gold was etched from the sample only in those areas which had been exposed to the ultraviolet rays.

EXAMPLE 3

In this example the substrate was a porous paper coated with a polymer containing only carbon and fluorine which polymer was produced by the surface photopolymerization of tetrafluorethylene at pressures below 5 torr. The paper had a coating of the polymer of approximately 100 angstroms thick. The coated paper was completely hydrophobic and could not be wet by water. A mask was then placed over the paper and the sample subjected to ultraviolet irradiation for 10 minutes in air. It was found that after 10 minutes of ultraviolet irradiation the polymer film had been decomposed and the paper in the area wherein the polymer film was removed was completely wettable whereas the surrounding areas which had been covered by the mask were still hydrophobic.

In the second sample, wherein the polymer coating on the paper was 500 Angstroms thick and the time of ultraviolet irradiation was 32 minutes, it was found that the area protected from the ultraviolet irradiation remained hydrophobic whereas the area which had been subjected to the ultraviolet irradiation become partially wettable by water.

EXAMPLE 4

A circuit consisting of resistors, capacitors, interconnections, and conductor runs can be formed by selective removal of multilayer thin film structures deposited on a supporting substrate as outlined in the following steps:

a. a thin resistive film of chromium is vapor deposited onto a substrate such as Mylar film (a polyethylene glycol terephthalate polymer) approximately 1 mil thick.
b. there is then vapor deposited onto the chromium layer a thin layer of aluminum of approximately 10,000 Angstroms thick.
c. a thin polymer film consisting essentially of carbon and chlorine is deposited by the photopolymerization of hexachlorobutadiene in accordance with the aforesaid copending patent applications.
d. a mask is then placed over the polymer film and the polymer film removed by exposure to ultraviolet light depolymerization as in Examples 1, 2, and 3. By this manner, one can leave polymer film patterns over the desired capacitor electrodes, bottom conductor runs, and resistor pattern. The patterned polymeric film protects the underlying metal areas from the etchants which are used in the subsequent steps of this example to form the actual metallic patterns.
e. the aluminum film is then etched off in the areas not protected by the polymeric film employing as a typical etchant a mixture of ferric chloride and hydrochloric acid.
f. the chromium film is then etched off in the areas not protected by the polymeric film. Any of the commercial chrome etchants can be employed in this step.
g. a resistor mask can be placed over the substrate and the film produced by polymerization of hexachlorobutadiene depolymerized to remove the polymer from the chromium-aluminum resistor patterns.
h. the aluminum film can be etched off the chromium-aluminum resistor patterns to form chromium resistors.
i. a mask can be placed over the pattern and a metal film such as aluminum be deposited through a metal mask to form the top capacitor electrodes and additional conductor and interconnection patterns.

EXAMPLE 5

The procedure of Example 1 is repeated, except that a composite is employed consisting of a glass base, an intermediate evaporated gold layer and an outer film of photopolymerized hexachlorobutadiene having a thickness of about 2,000 Angstroms.

The composite is placed in the chamber shown in FIG. 1 which is filled with oxygen to a pressure of about 10 torr. A Hanovia 700 watt medium pressure mercury lamp is positioned over the quartz window of the chamber at a distance of about 10 centimeters from the surface of the photopolymerized film of hexachlorobutadiene. A metal stencil is employed in contact with the film. Based on measurements utilizing a thermopile, the flux of the ultraviolet light emitted from the lamp is found to be about 500 milliwatts on the surface of the hexachlorobutadiene film. The temperature of the film during irradiation is found to be about 60° C. It is found that the hexachlorobutadiene film is removed in a patterned matter at a rate of about 10 Angstroms per minute.

The resulting composite showing exposed gold in a positive pattern with respect to the mask employed, is then treated with a gold etchant in the form of a water solution of iodine and potassium iodide as described in Example 1. The etched composite is then washed and air-dried. The resulting composite is then placed in the chamber for additional exposure. As shown in FIG. 3, the hexachlorobutadiene film is removed to produce a composite of glass having a layer of gold with a positive image of the mask etched into the gold surface. Auger analysis shows that the gold remaining on the surface of the glass is free of residual carbon.

EXAMPLE 6

A silicon wafer having a silicon oxide coating is coated with surface photopolymerized hexachlorobutadiene to a thickness of approximately 2,000 Angstroms. The resulting composite is then placed in a chamber in accordance with FIG. 2 under a GE H3T7 lamp operated at about 900 watts and positioned at a distance of about 1½ centimeters above the hexachlorobutadiene film. A stencil mask is then placed over the surface of the composite. As shown in FIG. 3, the hexachlorobutadiene film is removed in a pattern positive to the mask. The flux of light employed is approximately 5 watts per square centimeter, while a stream of oxygen at atmospheric pressure is directed over the surface of the wafer during irradiation. The average temperature of the surface of the wafer is maintained at about 250° C. Patterned film removal is achieved in less than 15 minutes, indicating an average removal rate of about 115 Angstroms per minute.

The resulting wafer is then etched with a buffered hydrogen fluoride etchant to produce a composite having a positive mask configuration in the hexachlorobutadiene layer and the silicon oxide layer. The wafer is then placed into the chamber and further irradiated under the same conditions as described above. There is obtained a composite of silicon oxide on silicon having a positive etched configuration in the silicon oxide as shown in FIG. 3. Auger analysis establishes that the silicon oxide is free of residual carbon.

EXAMPLE 7

The procedure of Example 6 is repeated, except a surface photopolymerized N-phenylmaleimide film having a thickness of about 6,000 Angstroms is employed on an evaporated aluminum layer supported by a glass base. A contact mask having lines of about 3 microns in width is placed over the N-phenylmaleimide film and the composite is irradiated in air for 2 hours at a distance of about 4 centimeters from the ultraviolet light source.

There is obtained a composite having exposed aluminum patterned in a positive manner with respect to the contact mask. The aluminum is etched with a standard aluminum etchant followed by washing the composite. The resulting composite is then irradiated in air as described above for a period of 2 hours. A composite of evaporated aluminum on glass is produced having a positive carbon-free image of the contact mask etched in aluminum as established by Auger analysis.

EXAMPLE 8

A silicon wafer having a diameter of about 1¼ inches and a uniform silicon oxide coating of about 1 micron was placed in a photoresist spinner and treated with a 6 percent solution of a polyacteylene in a solvent mixture of toluene and xylene. The silicon wafer was spun at about 2,000 rpm to produce a composite having a resist thickness of about 1,500 Angstroms. The polyacetylene employed in the polymer solution was a copolymer consisting essentially of about 97 mole percent of 2,2-bis(4′-propragyloxyphenylpropane) and about 3 mole percent of 1,4-diethynylbenzene. The treated silicon wafer was dried in air at room temperature for about 30 minutes utilizing a stream of nitrogen to facilitate the evaporation of solvent. There was obtained a silicon wafer composite having a silicon base, a silicon oxide coating of about 1 micron in thickness, and an upper polyacetylene layer at a thickness of about 1,500 Angstroms.

The silicon wafer composite was then placed in an exposure station and a contact mask was clamped in contact with the polyacetylene film. The polyacetylene film was then exposed for about 10 to 15 seconds to an ultraviolet light source in the form of a GE AH4 lamp having a rating of about 100 watts at a distance of about 10 centimeters from the top surface of the polyacetylene film. The exposed polyacetylene film was then developed by stirring the silicon wafer while immersed in toluene for about 4 minutes. The silicon wafer was then dried at about 60° C for 1 hour to strip the composite of solvent. The exposed silicon oxide on the composite was then etched with a hydrogen fluoride etching solution containing an ammonium fluoride buffer. After 11 minutes, the silicon wafer composite was then washed and rinsed with water and air dried at room temperature. There was obtained silicon wafer composite having a silicon base, a silicon oxide coating etched in a configurational pattern and protected by the photoresist.

The silicon wafer was then placed under a GE H3T7 lamp at 900 watts so that the upper surface of the polyacetylene resist was about 2 centimeters from the lamp. The silicon wafer was exposed to ultraviolet light emitted from the lamp resulting in a film surface temperature of about 220° C, while maintaining an air stream across the surface of the film at about 20 cubic feet per hour. It was found that the rate at which the film of the polyacetylene resist was removed at an average rate of about 130 Angstroms per minute. After about 18 to 20 minutes, there was obtained a silicon wafer having a negative image in silicon oxide of the contact mask etched on its surface. The silicon oxide was completely free of any residual carbon as established by Auger emission analysis.

Although the above examples illustrate only a few of the very many process variables which can be employed in the practice of the invention, it should be understood that the present invention is directed to the use of a much broader class of organic polymers and surface photopolymerizable monomers, as well as etchable substrates and conditions utilized.

We claim:

1. In a method for effecting the complete removal of organic polymeric film having a thickness of up to about 1 mil from at least portions of the surface of a substrate to produce substrate surface substantially free of such organic polymeric film, the improvement of effecting the complete removal of the organic polymeric film with ultraviolet light having an intensity of at least 100 milliwatts per square centimeter and a wavelength of from 1,800 to 3,000 Angstroms in the presence of oxygen at a partial pressure of at least 1 torr.

2. The method of claim 1, where the organic polymeric film is organic solvent insoluble.

3. The method of claim 1, where the organic polymeric film is removed from selected portions of the substrate.

4. The method of claim 3, where the organic polymeric film is removed in a configurational manner.

5. In a method for making a positive photoresist consisting of a composite of an etchable substrate and an organic polymeric film in contact thereto which is patterned on selected portions of the surface of the etchable substrate in a configurational manner to provide for the etching of exposed substrate surface by chemical means, the improvement of initially effecting the deposition of the organic polymeric film on the surface of the etchable substrate by the surface photopolymerization of a photopolymerizable organic material in vaporous form and thereafter effecting the complete removal of selected portions of the resulting organic polymeric from the surface of the etchable substrate with ultraviolet light at a wavelength of from about 1,800 to 3,000 Angstroms in the presence of oxygen at a partial pressure of at least 1 torr.

6. The method of claim 1, where the removal of the organic polymeric film is effected in air.

7. The method of claim 1, where the organic polymeric film is deposited from N-phenylmaleimide.

8. The method of claim 1, where the organic polymeric film is deposited from hexachlorobutadiene.

9. The method of claim 1, where the substrate is an evaporated metal film.

10. The method of claim 1, where the substrate is silicon or oxides thereof.

11. In a method for etching a substrate involving the employment of an ultraviolet light photosensitive aliphatically unsaturated organic solvent soluble organic polymer which can be rendered insoluble when exposed to ultraviolet light involving the steps of (1) depositing said organic polymer onto the surface of the substrate, (2) exposing selected portions of the organic polymeric film to light to configurationally alter the solubility characteristics of the exposed organic polymeric film, (3) dissolving soluble portions of the organic polymeric film to produce a substrate-organic polymeric film composite having exposed substrate surface in a desired configuration, (4) etching the exposed substrate surface with a chemical etchant, and (5) removing organic polymeric film from the remaining substrate surface, which involves the improvement of effecting the complete removal of organic polymeric film in (5) by exposing the film to ultraviolet light at an intensity of at least 100 milliwatts per square centimeter and at a wavelength of from about 1,800 to 3,000 Angstroms at about atmospheric pressure in the presence of an oxygen containing gas.

* * * * *